(12) United States Patent
Laporte (10) Patent No.: US 8,923,787 B2
(45) Date of Patent: Dec. 30, 2014

(54) LOW SAMPLING RATE ADAPTATION SCHEME FOR DUAL-BAND LINEARIZATION

(76) Inventor: Pierre-André Laporte, Gatineau (CA)

( * ) Notice: Subject to any disclaimer, the term of this patent is extended or adjusted under 35 U.S.C. 154(b) by 186 days.

(21) Appl. No.: 13/541,852

(22) Filed: Jul. 5, 2012

(65) Prior Publication Data

US 2014/0009225 A1     Jan. 9, 2014

(51) Int. Cl.
*H04B 1/04*     (2006.01)

(52) U.S. Cl.
USPC ........................................ 455/114.3; 375/296

(58) Field of Classification Search
USPC ................. 455/114.3, 114.2, 91, 63.1, 67.13; 375/296, 295, 297; 330/151, 149, 136
See application file for complete search history.

(56) References Cited

U.S. PATENT DOCUMENTS

| | | | |
|---|---|---|---|
| 6,549,067 B1* | 4/2003 | Kenington ....................... | 330/52 |
| 6,999,523 B2* | 2/2006 | Posti .............................. | 375/296 |
| 7,170,344 B2* | 1/2007 | Suzuki et al. ................. | 330/149 |
| 7,183,847 B2* | 2/2007 | Suzuki et al. ................. | 330/149 |
| 7,539,464 B2* | 5/2009 | Suzuki et al. .............. | 455/114.3 |
| 7,848,717 B2* | 12/2010 | Liu ............................ | 455/114.3 |
| 8,391,809 B1* | 3/2013 | Fuller ......................... | 455/114.3 |
| 8,619,906 B2* | 12/2013 | Bai .............................. | 375/297 |
| 8,634,494 B2* | 1/2014 | Bai .............................. | 375/297 |
| 2012/0068768 A1* | 3/2012 | Ishikawa et al. .............. | 330/149 |
| 2013/0064325 A1* | 3/2013 | Kilambi et al. ............... | 375/297 |
| 2013/0094610 A1* | 4/2013 | Ghannouchi et al. ......... | 375/296 |

OTHER PUBLICATIONS

Bassam S. et al., "2-D Digital Predistortion (2D-DPD) Architecture for Concurrent Dual-Band Transmitter", IEEE Transactions on Microwave Theory and Technique, vol. 59, No. 10, Oct. 2011, pp. 2547-2553.

International Search Reporting and Written Opinion dated Jan. 8, 2014 for International Application No. PCT/IB2013/054250, International Filing Date: May 22, 2013 consisting of 8-pages.

Choi et al.: "Design of digital predistorters for wideband power amplifiers in communication systems with dynamic spectrum allocation", Acoustics, Speech and Signal Processing (ICASSP), 2011 IEEE International Conference on, IEEE, May 22, 2011, pp. 3204-3207, XP032001036, DOI: 10.1109/ ICASSP.2011.5946703 ISBN: 978-1-4577-0538-0 DOI: http://dx.doi.org/10.1109/ICASSP.2011. 5946703 consisting of 4-pages (May 22, 2011).

Bassam et al.: "Subsampling Feedback Loop Applicable to Concurrent Dual-Band Linearization Architecture", IEEE Transactions on Microwave Theory and Techniques, IEEE Service Center, Piscataway, NJ, US, vol. 60, No. 6, Jun. 1, 2012, pp. 1990-1999, XP011445306, ISSN: 0018-9480, DOI: 10.1109/ TMTT.2012. 2192745 DOI: http://dx.doi.org/10.1109/TMTT.2012.2192745 consisting of 10-pages. (Jun. 1, 2012).

* cited by examiner

*Primary Examiner* — Sonny Trinh
(74) *Attorney, Agent, or Firm* — Christopher & Weisberg, P.A.

(57) ABSTRACT

A method and system for determining adaptation parameters for pre-distorters in a multi-band power amplifier system of a communication system are disclosed. A method includes receiving, at an adaptor, a reference signal comprising a first plurality of signals having substantially overlapping frequency spectra. Each of the first plurality of signals is input to a corresponding one of a plurality of pre-distorters. The adaptor also receives an observation signal comprising a second plurality of signals tuned to substantially a same frequency to have overlapping frequency spectra. Each of the second plurality of signals is derived from an output of the multi-band power amplifier system. The adaptor computes the adaptation parameters based on the reference signal and the observation signal.

19 Claims, 8 Drawing Sheets

FIG. 3 (PRIOR ART) Same bandwiths

FIG. 4 (PRIOR ART) Different bandwiths

FIG. 5

FIG. 6 Same bandwiths

FIG. 7 Different bandwiths

LOW SAMPLING RATE ADAPTATION SCHEME FOR DUAL-BAND LINEARIZATION

TECHNICAL FIELD

The present invention relates to electronic communication, and in particular to determination of adaptation parameters for use in pre-distorters of a multi-band power amplifier system.

BACKGROUND

The design of radio-frequency power amplifiers for communications applications often involves a trade-off between linearity and efficiency. Power amplifiers are typically most efficient when operated at or near their saturation point. However, the response of the amplifier at or near the point of saturation is non-linear. Generally speaking, when operating in the high-efficiency range, a power amplifier's response exhibits a nonlinear response and memory effects.

One way to improve a power amplifier's efficiency and its overall linearity is to digitally pre-distort the input to the power amplifier to compensate for the distortion introduced by the power amplifier. In effect, the input signal is adjusted in anticipation of the distortion to be introduced by the power amplifier, so that the output signal is largely free of distortion products. Generally, digital pre-distortion is applied to the signal at baseband frequencies, i.e., before the signal is up-converted to radio frequencies.

Thus, for a power amplifier to achieve high efficiency, the power amplifier is operated in a non-linear region. This causes distortion of the input signal and broadening of the bandwidth of the input signal. To compensate for the distortion of the signal introduced by the power amplifier, the input signal is first passed through a pre-distorter that pre-distorts the input signal. A typical pre-distorter is itself non-linear, having a non-linearity that compensates for the non-linearity of the pre-distorter. To illustrate, a power amplifier may exhibit first and third order effects characterized by a polynomial function of the input that may be written for third order non-linearities as:

$$y = f_{NL\text{-}IM3}(x) = a_1 x + a_3 x^3 \quad (01)$$

where x is the input signal and $a_3$ is much less than $a_1$. The function f is the response of the power amplifier to the input x and the subscript NL-IM3 denotes non-linearity up to order three. To compensate for the distortion introduced by the power amplifier, a pre-distorter may have a response that is a polynomial function of the input:

$$z = f_{PD\text{-}IM3}(x) = b_1 x + b_3 x^3 \quad (02)$$

Substituting equation (02) into equation (01) leads to:

$$y = f_{NL\text{-}IM3}(f_{PD\text{-}IM3}9x)) = a_1 b_1 x + (a_1 b_3 + a_3 b_1^3) x^3 + O(x^5) \quad (03)$$

where $O(x^5)$ are terms of 5th order or higher. By appropriate selection of the coefficients $b_1$ and $b_3$, the third order term may be removed at the expense of creating higher order terms of less significant magnitude. The solution to achieve this is given by:

$$b_3 = -a_3 b_1^3 / a_1 \quad (04)$$

Without loss of generality, assume that $a_1 = b_1 = 1$. Then the solution to compensate for third order distortions is:

$$b_3 = -a_3 \quad (05)$$

This simple illustration is for third order non-linearities. For higher order non-linearities, the same approach may be taken to cancel the higher order terms. Thus, the pre-distorter is a non-linear device that compensates for the distortion caused by the power amplifier.

These techniques can be quite beneficial in improving the overall performance of a transmitter system, in terms of both linearity and efficiency. Furthermore, these techniques can be relatively inexpensive, due to the digital implementation of the pre-distorter. In fact, with the availability of these techniques, power amplifiers may be designed in view of more relaxed linearity requirements than would otherwise be permissible, thus potentially reducing the costs of the overall system.

The bandwidth of the pre-distorter must be wider than the bandwidth of the input signal depending on the order of inter-modulation to be compensated by the pre-distorter. For example, for third order inter-modulations, the pre-distorted signal occupies about three times the bandwidth of the input signal to the pre-distorter. For fifth order inter-modulations, the pre-distorted signal occupies about 5 times the bandwidth of the input signal. Higher bandwidth implies that the sampling rate of the pre-distorted signal must be higher than the sampling rate of the sampled baseband signal to avoid aliasing.

Figure 1:
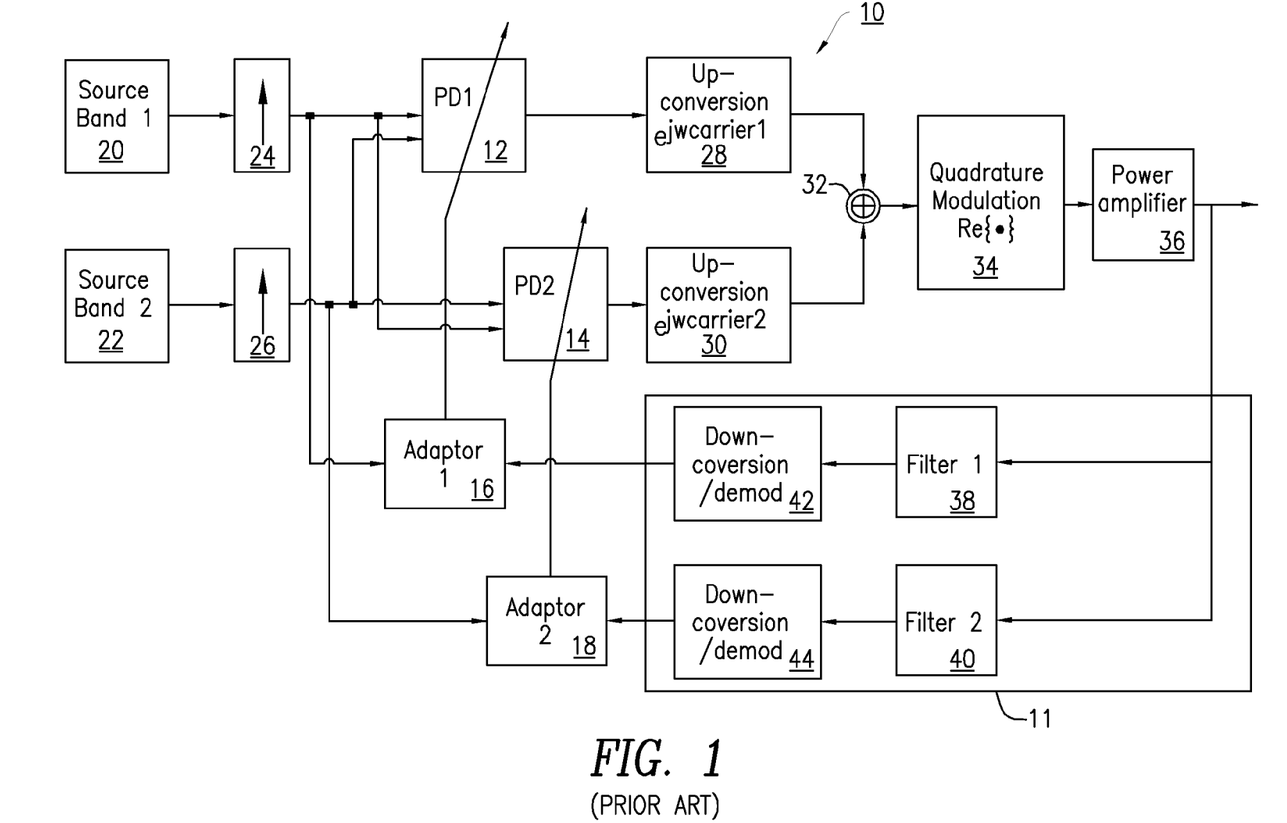
FIG. 1 is a block diagram of a known power amplifier system.

FIG. 1 shows a known dual band power amplifier system 10 with pre-distorters 12 and 14 and adaptors 16 and 18. The adaptors 16 and 18 determine pre-distorter coefficients for pre-distorters 12 and 14, respectively. Each pre-distorter 12 and 14 receives a signal from a respective source 20 and 22 that is up-sampled by a corresponding up-sampler 24 or 26. These inputs to the pre-distorters 12 and 14 are reference signals that are also input to the adaptors 16 and 18, respectively. The outputs of the pre-distorters 12 and 14 are up-converted in frequency to a first carrier $e^{j\omega_{carrier1}}$ and a second carrier $e^{j\omega_{carrier2}}$, respectively, via a corresponding up-conversion unit 28 or 30. The outputs of the up-conversion units 28 and 30 are summed by an adder 32. The output of the adder 32 may be quadrature-modulated by a quadrature modulation unit 34. The output of the quadrature modulation unit 34 is input to the power amplifier 36. The output of the power amplifier 36 is input to one of two filters 38 and 40 of an observation receiver 11. The outputs of these filters are down-converted and demodulated by down conversion/demodulation units 42 and 44, respectively. The outputs of units 42 and 44 are observation signals that are input to the adaptors 16 and 18, respectively.

Figure 2:
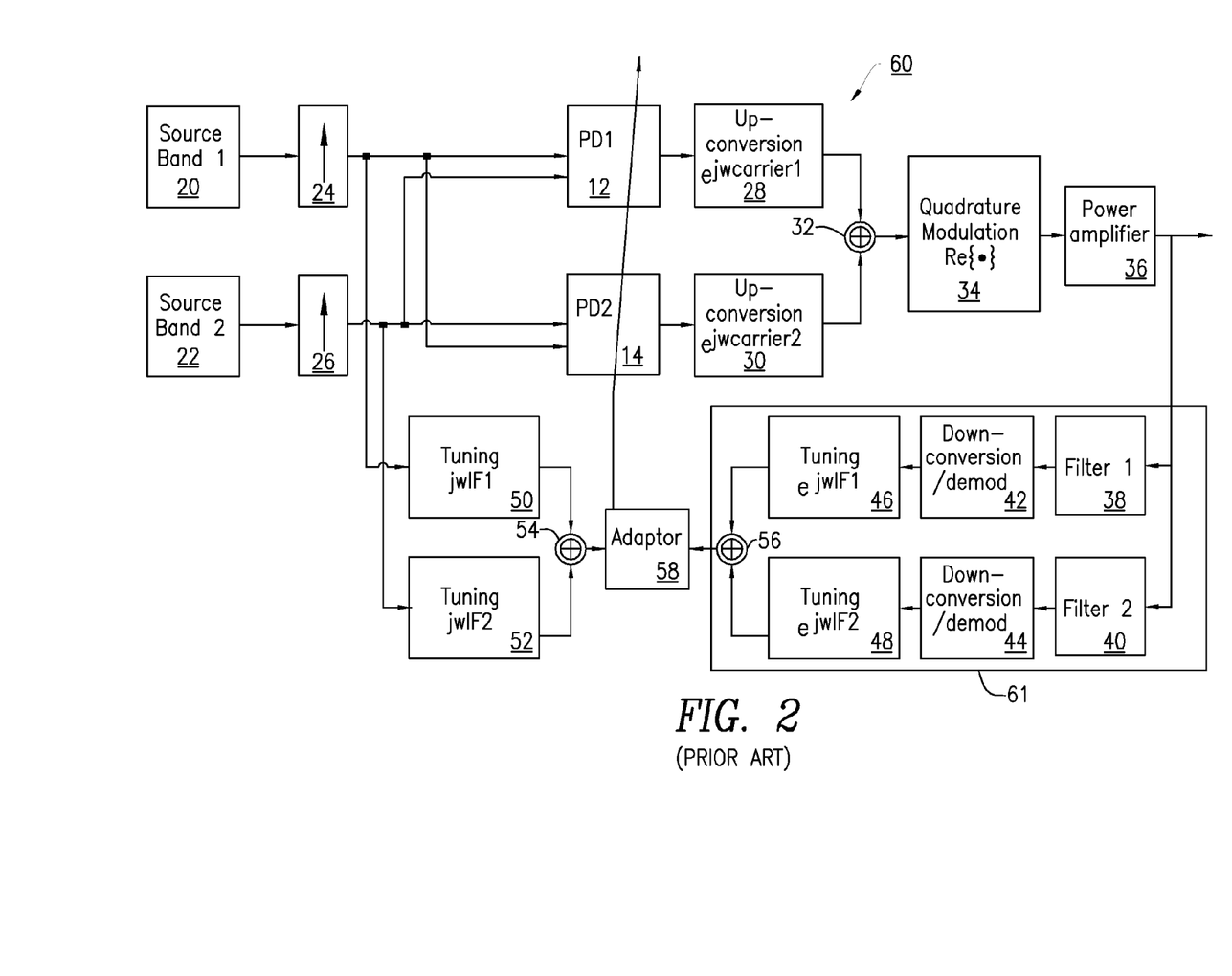
FIG. 2 is a block diagram of a known power amplifier system.

FIG. 2 shows a known alternative power amplifier system 60 using only a single adaptor 58. The observation signal inputs to the adaptor 58 are tuned to IF1 and IF2 by corresponding tuners 46 and 48 of the observation receiver 61. Similarly, the reference signal inputs to the adaptor 58 are tuned to IF1 and IF2 by tuners 50 and 52. In the configuration of FIG. 2, the adaptation parameters produced by the adaptor 58 are used by both pre-distorters 12 and 14. The basis functions in each pre-distorter, for fifth order non-linearity compensation are of the form:

$$y_1 = x_1 + x_1 |x_1|^2 + x_1 |x_2|^2 + x_1 |x_1|^4 + x_1 |x_1|^2 |x_2|^2 + x_1 |x_2|^4 \quad (06)$$

$$y_2 = x_2 + x_2 |x_2|^2 + x_2 |x_1|^2 + x_2 |x_2|^4 + x_2 |x_2|^2 |x_1|^2 + x_2 |x_1|^4 \quad (07)$$

where $y_1$ and $y_2$ represent the output of the pre-distorters 12 and 14, respectively, and $x_1$ and $x_2$ are the baseband input signals input to the pre-distorters 12 and 14, respectively. The error that the adaptor seeks to minimize is given by:

$$e = (x_1 e^{j\omega IF1} + x_2 e^{j\omega IF2}) - \begin{pmatrix} (c_0 x_1 + c_1 x_1 |x_1|^2 + c_2 x_1 |x_2|^2 + c_3 x_1 |x_1|^4 + \\ c_4 x_1 |x_1|^2 |x_2|^2 + c_5 x_1 |x_2|^4) e^{j\omega IF1} + \\ (c_0 x_2 + c_1 x_2 |x_2|^2 + c_2 x_2 |x_1|^2 + c_3 x_2 |x_2|^4 + \\ c_4 x_2 |x_2|^2 |x_1|^2 + c_5 x_2 |x_1|^4) e^{j\omega IF2} \end{pmatrix} \quad (08)$$

where $c_0$-$c_{n-1}$ are the coefficients generated by the adaptor 58.

Figure 3:
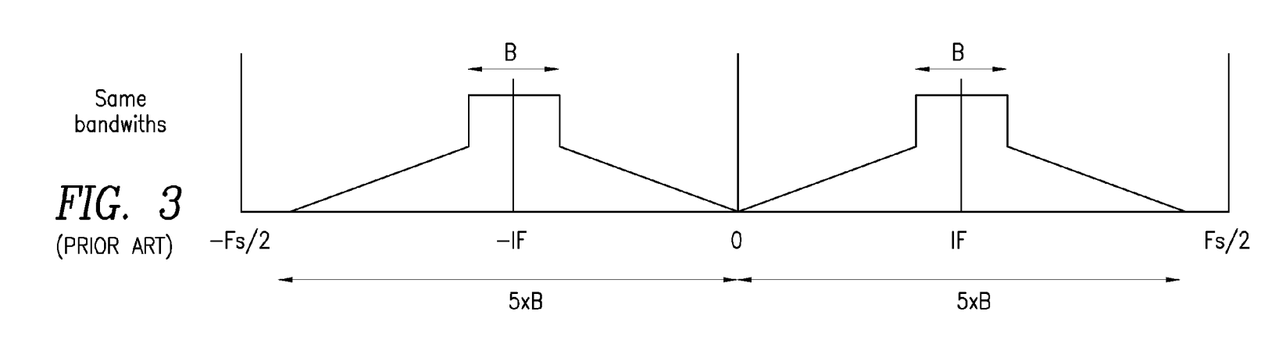
FIG. 3 is a graph of a dual band signal with each band having a same bandwidth.
Figure 4:
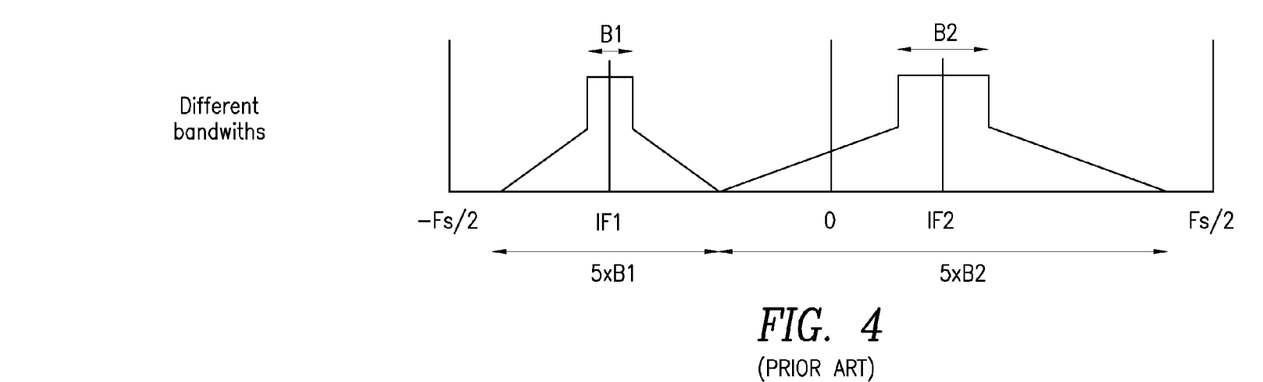
FIG. 4 is a graph of a dual band signal with each band having a different bandwidth.

FIG. 3 shows fifth order pre-distortion of signals received from sources 20 and 22 that each have an original bandwidth B. To avoid aliasing of these two signals when added in adder 56, the signals must be sampled at the Nyquist rate of at least 5×2×B and tuned to an intermediate frequency IF equal to +/−B/2. FIG. 4 shows fifth order distortion of signals received from the sources 20 and 22 that have an original bandwidth of B1 and B2, respectively. To avoid aliasing, the signals must be un-converted to respective intermediate frequencies IF1 and IF2, given by:

$$IF1 = -\frac{5(B_1+B_2)}{2} + \frac{5}{2}B_1 = -\frac{5}{2}B_2 \quad (09)$$

$$IF2 = \frac{5(B_1+B_2)}{2} - \frac{5}{2}B_2 = \frac{5}{2}B_1 \quad (10)$$

and the sampling rate must be chosen as:

$$fs > 5 \times (b_1 + B_2) \quad (11)$$

The embodiment of FIG. 2 requires a high sampling rate inside the adaptor 58. A very high sampling rate is undesirable since a high clock rate may not be available within the system, and/or is more costly to implement, consumes additional power, etc.

SUMMARY

The present invention advantageously provides a method and system for determining adaptation parameters for pre-distorters in a multi-band power amplifier system of a communication system. According to one aspect, the invention provides a method that includes receiving, at an adaptor, a reference signal comprising a first plurality of signals having substantially overlapping frequency spectra. Each of the first plurality of signals is input to a corresponding one of a plurality of pre-distorters. The adaptor also receives an observation signal comprising a second plurality of signals tuned to substantially a same frequency to have overlapping frequency spectra. Each of the second plurality of signals is derived from an output of the multi-band power amplifier system. The adaptor computes the adaptation parameters based on the reference signal and the observation signal.

According to another aspect, the invention provides an adaptor for a multi-band power amplifier system having a plurality of pre-distorters and a power amplifier. The adaptor includes a first input that receives a reference signal. The reference signal includes a first plurality of signals having substantially overlapping frequency spectra centered at baseband. The adaptor includes a second input receiving an observation signal. The observation signal includes a second plurality of signals derived from the output of the power amplifier. The second plurality of signals have substantially overlapping frequency spectra centered at baseband. The adaptor further includes a processor configured to compute adaptation parameters based on the reference signal and the observation signal.

According to another aspect, the invention provides a multi-band power amplifier system that includes at least a first pre-distorter and a second pre-distorter. The first pre-distorter has a first output and the second pre-distorter has a second output. Both the first and second pre-distorters receive as inputs at least a first signal and a second signal. A power amplifier amplifies a signal derived from the first and second outputs of the first and second pre-distorters to produce a power amplifier output signal. The multi-band power amplifier system includes an adaptor configured to receive a reference signal that is a combination of at least the first signal and the second signal. The first and second signals are combined so that their frequency spectra substantially overlap. The adaptor is also configured to receive an observation signal that is a combination of at least a third signal and a fourth signal. The third and fourth signals are derived from the power amplifier output signal. The third and fourth signals are combined so that their frequency spectra substantially overlap. The adaptor is also configured to compute a set of adaptation parameters to be used by at least the first and second pre-distorters. The adaptation parameters are based on the reference signal and the observation signal.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Before describing in detail exemplary embodiments that are in accordance with the present invention, it is noted that the embodiments reside primarily in combinations of apparatus components and processing steps related to determine adaptation parameters for pre-distorters in a multi-band power amplifier system of a communication system. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Figure 5:
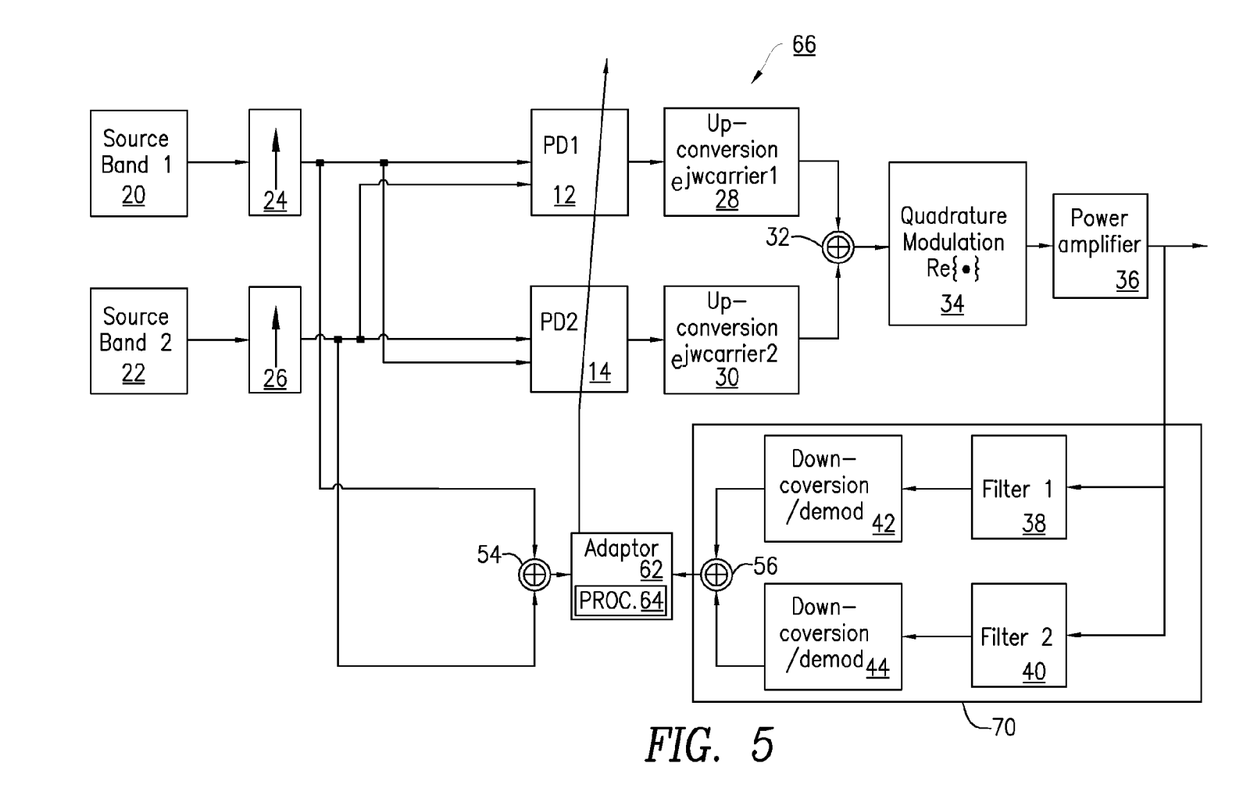
FIG. 5 is a block diagram of an exemplary multi-band power amplifier system constructed in accordance with principles of the present invention.

Referring now to the drawing figures, in which like reference designators denote like elements, there is shown in FIG. 5 a block diagram of an exemplary multi-band power amplifier system 66 constructed in accordance with principles of the present invention. The reference signal and observation signal input to the adaptor 62 of FIG. 5 are baseband signals, consisting of signals with substantially overlapping frequency spectra. Thus, system 66 of FIG. 5 has outputs of up-samplers 24 and 26 that are added by an adder 54 to produce a reference signal comprising the up-sampled outputs of the sources 20 and 22 having frequency spectra that are centered at baseband and that substantially overlap.

System 66 of FIG. 5 also has an observation signal that is derived from two components of the output of the power amplifier that are converted to baseband and combined by an adder 56 so that the baseband signals output by the adder 56 have frequency spectra that substantially overlap. Thus, as shown in FIG. 5, the output of the power amplifier 36 is input to separate channels, each channel producing one of a plurality of signals combined to produce the observation signal. Each of the separate channels includes a filter 38, 40, and a down-conversion/demodulator unit 42, 44. The filters 38 and 40 are each tuned to a carrier frequency $\omega_{carrier1}$ and $\omega_{carrier2}$, respectively. The down-conversion/demodulation units 42 and 44 down-convert the signals from the filters 38 and 40 to baseband, and the resultant baseband signals are input to the adder 56. For example, down-conversion unit 42 may operate at $\omega_{carrier1}$ and down-conversion unit 44 may operate at $\omega_{carrier2}$. The output of the adder 56 is the combined baseband signals with substantially overlapping frequency spectra. This is the observation signal to be input to the adaptor 62.

The processor 64 of the adaptor 62 is configured to compute a set of adaptation parameters based on the reference signal and the observation signal. The set of adaptation parameters computed by the processor 64 are used by both pre-distorters 12 and 14 to pre-distort the inputs signals from the up-samplers 24 and 26. In one embodiment, the adaptation parameters computed by the processor 64 are the set of coefficients, $c_0$-$c_{n-1}$, that minimize the error given by:

$$e = (x_1 + x_2) - \begin{pmatrix} (c_0 x_1 + c_1 x_1 |x_1|^2 + c_2 x_1 |x_2|^2 + c_3 x_1 |x_1|^4 + \\ c_4 x_1 |x_1|^2 |x_2|^2 + c_5 x_1 |x_2|^4) + \\ (c_0 x_2 + c_1 x_2 |x_2|^2 + c_2 x_2 |x_1|^2 + c_3 x_2 |x_2|^4 + \\ c_4 x_2 |x_2|^2 |x_1|^2 + c_5 x_2 |x_1|^4) \end{pmatrix} \quad (12)$$

where $x_1$ and $x_2$ are the inputs to the pre-distorters 12 and 14, respectively, and n is the number of polynomial terms. Thus, the adaptation parameters are computed by minimizing an error between the reference signal and the observation signal. The determined coefficients are supplied to the pre-distorters to be applied to the up-sampled signals from up-samplers 24 and 26. In particular, the pre-distorters compute the outputs:

$$y_1 = x_1 + x_1|x_1|^2 + x_1|x_2|^2 + x_1|x_1|^4 + x_1|x_1|^2|x_2|^2 + x_1|x_2|^4 \quad (13)$$

$$y_2 = x_2 + x_2|x_2|^2 + x_2|x_1|^2 + x_1|x_2|^4 + x_2|x_2|^2|x_1|^2 + x_2|x_1|^4 \quad (4)$$

where $y_1$ and $y_2$ are the outputs of the first and second pre-distorters 12 and 14, respectively.

Figure 6:
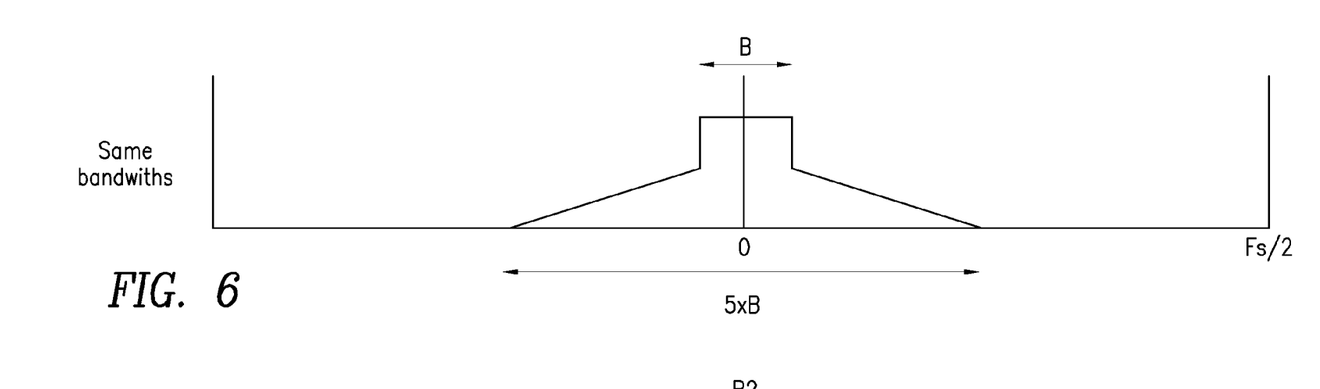
FIG. 6 is a graph of two overlapping signals with the same bandwidth.
Figure 7:
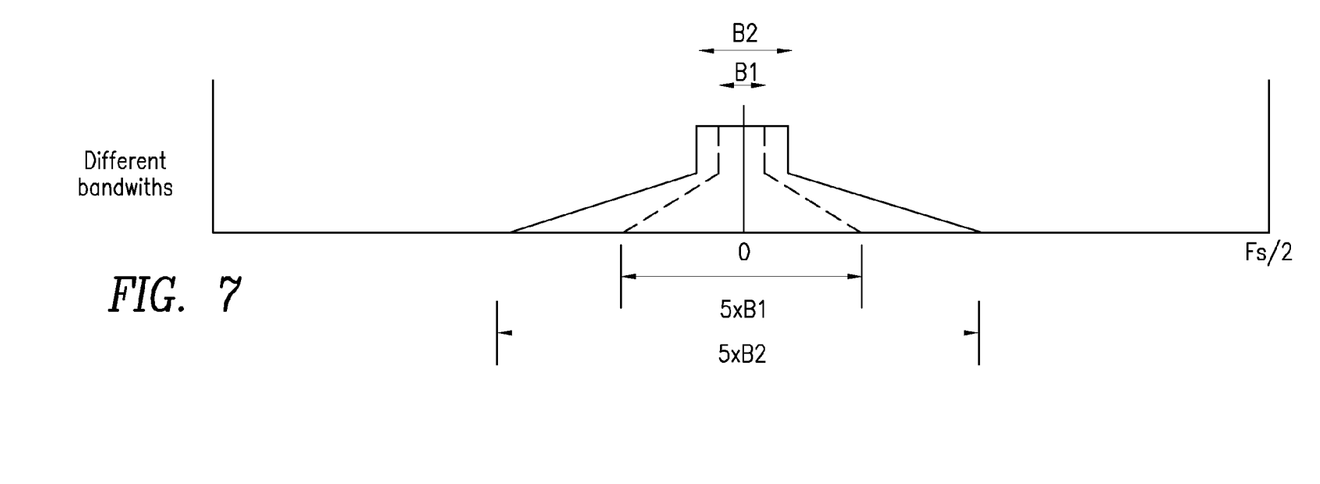
FIG. 7 is a graph of two overlapping signals with different bandwidths.

The inputs to the adaptor 62 have substantially overlapping frequency spectra. This is shown in FIG. 6 for two signals having the same bandwidth B. FIG. 7 shows the overlapping frequency spectra of two signals having different bandwidths B1 and B2. Because the signals have overlapping spectra, the minimum required sampling rate is given by:

$$fs > 5 \times max(B_1, B_2) \quad (15)$$

which is less than the sampling rate that would be required for non-overlapping spectra, as given by equation (11). Thus, the sampling rate of the adaptor is chosen based on a bandwidth of the source signals from the sources 20, 22 having the largest bandwidth. More particularly, if an order of non-linearities to be corrected by the pre-distorters is N, the sampling rate of the adaptor is chosen to be substantially N times the bandwidth of the source signal having the largest bandwidth:

$$fs > N \times max(B_1, B_2) \quad (16)$$

where $f_s$ is the sampling rate.

Figure 8:
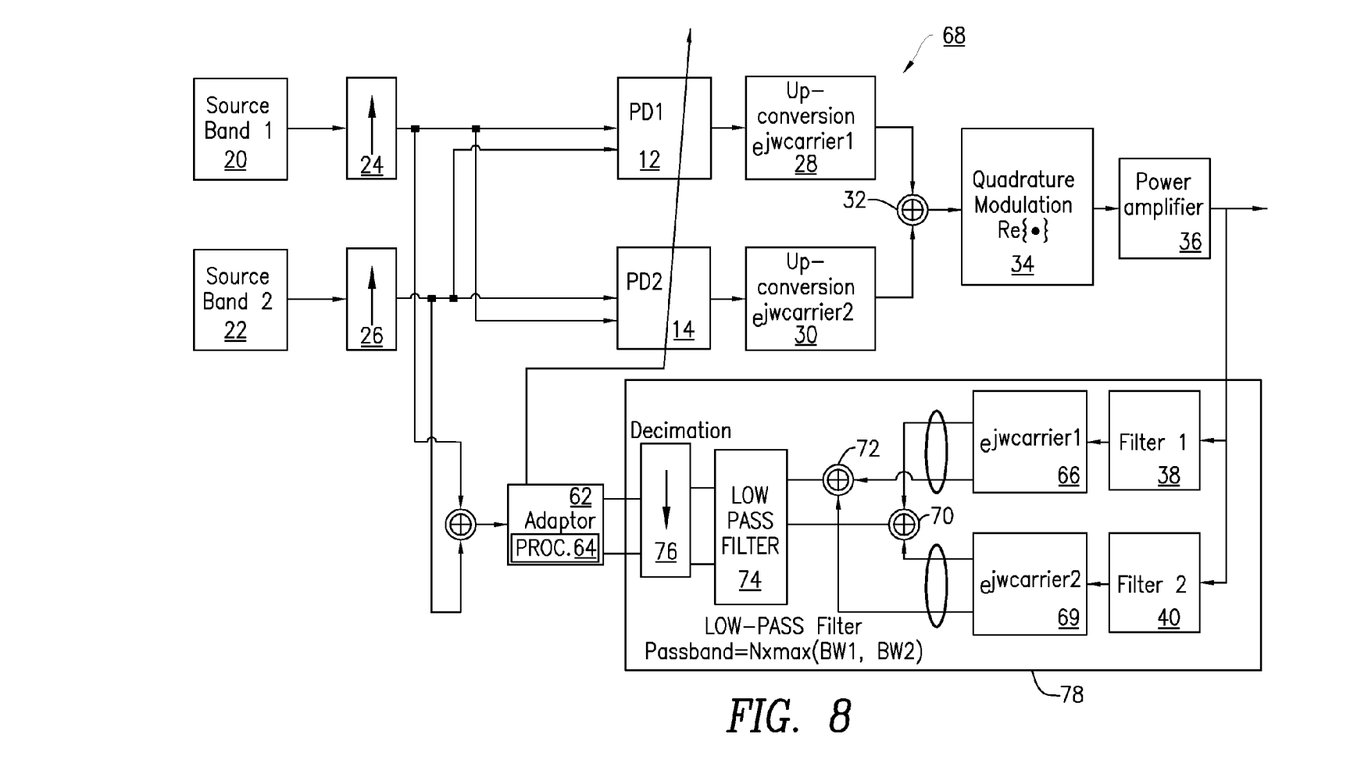
FIG. 8 is a block diagram of another exemplary multi-band power amplifier system constructed in accordance with principles of the present invention.

Thus, one embodiment is an adaptor 62 for a multi-band power amplifier system 66, 68 having a plurality of pre-distorters 12, 14 and a power amplifier 36. A first input of the adaptor 62 receives a reference signal comprising a first plurality of signals having substantially overlapping frequency spectra centered at baseband. A second input of the adaptor 62 receives an observation signal comprising a second plurality of signals derived from an output of the power amplifier, and having substantially overlapping frequency spectra at baseband. The adaptor 62 includes a processor 64 configured to compute adaptation parameters based on the reference signal and the observation signal.

Embodiments described and shown in the drawing figures are dual-band embodiments where two input signals are pre-distorted. The dual-band embodiments are described solely for ease of understanding. It is understood that the inventions described and claimed herein are not limited to dual-band embodiments, but may encompass embodiments having more than two bands. Thus, for example, an embodiment for pre-distortion of 3 signals could have 3 signal sources, 3 pre-distorters, and one adaptor. The reference signal input to the adaptor would have the three signals from the signal sources with substantially overlapping frequency spectra at baseband. Similarly, the observation signal would be derived from three components of the output of the power amplifier, the three components having substantially overlapping frequency spectra when converted to baseband.

Thus, one embodiment is a multi-band power amplifier system 66, 68, having at least a first pre-distorter 12 and a second pre-distorter 14, each having an output that is about N times wider in bandwidth than its input, where N is the order of non-linearities to be compensated. The outputs of the first and second pre-distorters are up-converted so that each output is centered at a different carrier frequency. The up-converted signals are combined and amplified by a power amplifier 36 to produce a power amplifier output signal. The multi-band power amplifier system 66, 68 also includes an adaptor 62 configured to receive a reference signal and an observation signal. The reference signal is a combination of at least a first and a second source. The frequency spectra of the combined input signals substantially overlap. The observation signal is a combination of a third signal and a fourth signal whose frequency spectra substantially overlap. The third signal and the fourth signal are derived from the power amplifier output signal. The adaptor 62 computes a set of adaptation parameters to be used by at least the first and second pre-distorters. In particular, in some embodiments, the adaptation parameters are coefficients of a polynomial function of the input signals, $x_1$ and $x_2$, of the pre-distorters.

Figure 9:
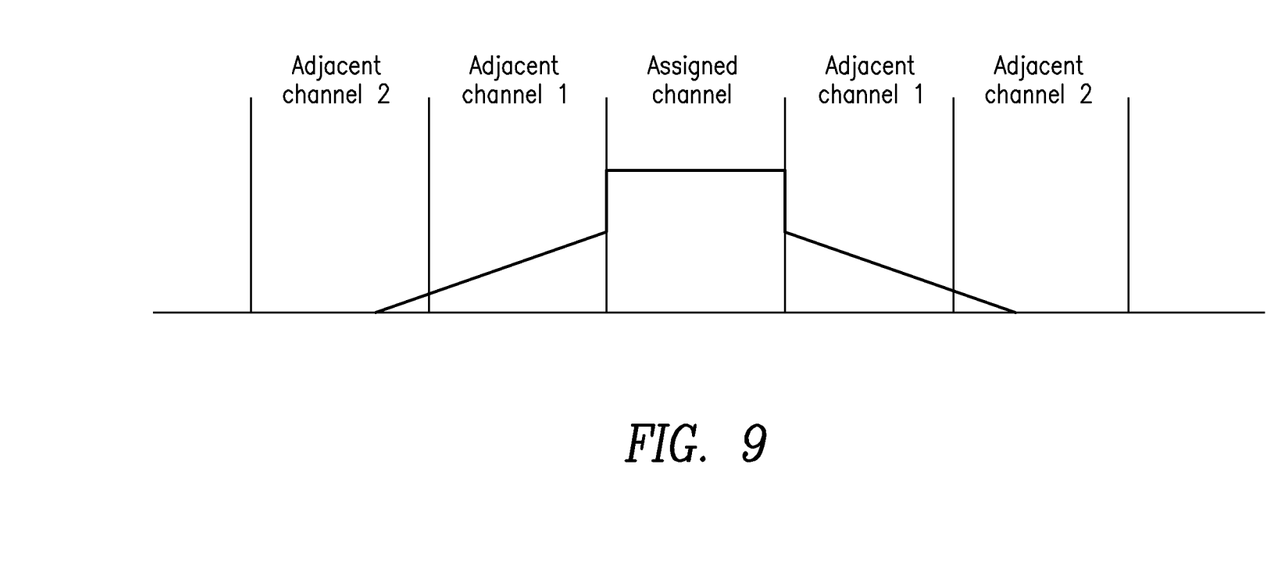
FIG. 9 is a graph of adjacency channel leakage based on the signals of FIG. 7.

FIG. 8 shows an exemplary alternative embodiment of a dual-band power amplifier system 68 constructed in accordance with principles of the present invention. The output of the filter 38 is centered at ωcarrier1 and the output of the filter 40 is centered at ωcarrier2. The down-converters 66 and 68 of the observation receiver 78 down-convert the outputs of the filters 38 and 40. The outputs of the down-converters 66 and 69 are complex signals which are combined by the adders 70 and 72, low-pass-filtered by the low pass filter 74 and down-sampled by the decimator 76. FIG. 9 shows a graph of adjacent channel leakage for the two signals shown in FIG. 7. The adjacent channel leakage ration (ACLR) for adjacent channel 1 is given by:

$$ACLR1 = 10 \times \log_{10}\left(\frac{P_{adjacent\_channel1}}{P_{assigned\_channel}}\right). \quad (17)$$

The ACLR for adjacent channel 2 is given by:

$$ACLR2 = 10 \times \log_{10}\left(\frac{P_{adjacent\_channel2}}{P_{assigned\_channel}}\right). \quad (18)$$

The ACLR is a commonly used measure of the performance for transmitters. Table 1 shows simulation results for the embodiments of FIG. 2 and FIG. 5. The input signals had a bandwidth of 40 Mega-Hertz (MHz) and the power amplifier was modeled by a memory-less hyperbolic tangent function. In the simulation, the basis functions were polynomials providing compensation for up to fifth order non-linearities.

TABLE 1

| Adaptation Architecture | Convergence (# Iterations) | Worst case ACLR1 (dBc) |
|---|---|---|
| Intermediate frequencies FIG. 2 | 8 | −64.5 |
| Proposed architecture FIG. 5 | 8 | −64.5 |

Table 1 shows that the number of iterations of the adaptor to converge to a solution is the same for both a known configuration, such as shown in FIG. 2, and the embodiment of FIG. 5. Further, both the embodiments of FIGS. 2 and 5 result in a worst case ACLR of about −64.5 decibels (dB). Table 2 shows simulation results for the embodiments of FIG. 2 and FIG. 5 for two input signals having different bandwidths. A first input signal had a bandwidth of 40 MHz and a second input signal had a bandwidth of 10 MHz. Accordingly, the sampling rate inside the adaptor for the embodiment of FIG. 5 was chosen to be 5×40 MHz.

TABLE 2

| Adaptation Architecture | Convergence (# Iterations) | Worst case ACLR1 (dBc) |
|---|---|---|
| Intermediate frequencies FIG. 2 | 8 | −66.3 |

TABLE 2-continued

| Adaptation Architecture | Convergence (# Iterations) | Worst case ACLR1 (dBc) |
|---|---|---|
| Proposed architecture FIG. 5 | 8 | −66.3 |

Once again, the embodiments of FIGS. 2 and 5 produce similar results in terms of the rate of convergence of the adaptor and the resulting ACLR1. Thus, it can be seen that converting the baseband input signals from the sources 20 and 22 to intermediate frequencies IF1 and IF2 is unnecessary and the sampling rate can be based on the greater of the two bandwidths of the baseband input signals rather than the sum of their bandwidths. Accordingly, advantages of the inventive embodiments described herein may include reduced sampling rate, reduced power consumption, less silicon area required to implement the embodiments, and reduced complexity of the observation receiver 70, 78, to achieve the same performance as the more complex arrangements of the prior art.

Figure 10:
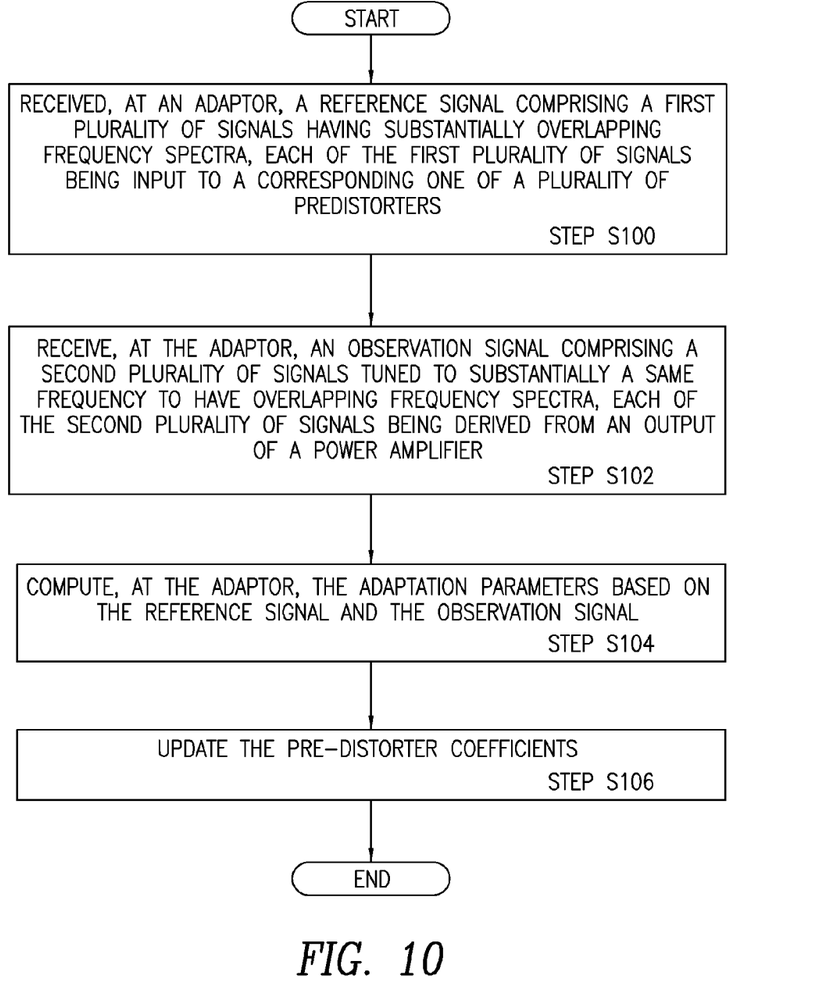
FIG. 10 is a flowchart of an exemplary process for determination of adaptation parameters for use in pre-distorters of a multi-band power amplifier system.

FIG. 10 is a flowchart of an exemplary process for determination of adaptation parameters for use in pre-distorters of a multi-band power amplifier system. The process includes receiving, at an adaptor, a reference signal that includes a first plurality of signals having substantially overlapping frequency spectra, where each of the first plurality of signals is input to a corresponding one of a plurality of pre-distorters (step S100). The adaptor also receives an observation signal that includes a second plurality of signals tuned to substantially the same frequency to have overlapping frequency spectra, where the second plurality of signals are derived from an output of a power amplifier (step S102). The adaptor computes adaptation parameters based on the reference signal and the observation signal (step S104). The system then updates the pre-distorter coefficients with the new values (step S106).

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile tangible storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method for determining adaptation parameters for use in pre-distorters of a multi-band power amplifier system, the method comprising:
   receiving, at an adaptor, a reference signal comprising a first plurality of signals having substantially overlapping frequency spectra, each of the first plurality of signals being substantially centered at baseband, each of the first plurality of signals being input to a corresponding one of a plurality of pre-distorters;
   receiving, at the adaptor, an observation signal comprising a second plurality of signals tuned to substantially a same frequency to have overlapping frequency spectra, each of the second plurality of signals being derived from an output of the multi-band power amplifier system; and
   computing, at the adaptor, the adaptation parameters based on the reference signal and the observation signal.

2. The method of claim 1, wherein the second plurality of signals are derived from the output of the multi-band power amplifier by channeling the output into separate channels, each channel producing one of the second plurality of signals.

3. The method of claim 2, wherein each channel includes a filter, a demodulator, and a down-converter.

4. The method of claim 1, wherein a sampling rate of the adaptor is chosen based on a bandwidth of a signal of the first plurality of signals having the largest bandwidth.

5. The method of claim 1, wherein, when an order of non-linearities to be corrected by the pre-distorters is N, the sampling rate of the adaptor is chosen to be substantially N times a bandwidth of a signal of the first plurality of signals having the largest bandwidth.

6. The method of claim 1, wherein each of the second plurality of signals is substantially centered at baseband.

7. An adaptor for a multi-band power amplifier system, the multi-band power amplifier system having a plurality of pre-distorters and a power amplifier, the power amplifier having an output, the adaptor comprising:
   a first input receiving a reference signal, the reference signal comprising a first plurality of signals having substantially overlapping frequency spectra centered at baseband;
   a second input receiving an observation signal, the observation signal comprising a second plurality of signals derived from the output of the power amplifier, the second plurality of signals having substantially overlapping frequency spectra centered at baseband; and
   a processor, the processor configured to compute adaptation parameters based on the reference signal and the observation signal, the adaptation parameters being computed by minimizing an error between the reference signal and the observation signal.

8. The adaptor of claim 7, wherein the processor is further configured to output the adaptation parameters to each of the plurality of pre-distorters.

9. The adaptor of claim 7, wherein the adaptation parameters are coefficients of a polynomial for application by a corresponding pre-distorter of the plurality of pre-distorters to a signal received by the corresponding pre-distorter.

10. The adaptor of claim 7, wherein a sampling rate of the adapter is substantially N times a bandwidth of a one of the first plurality of signals having a largest bandwidth, where N is an order of non-linearity to be compensated by the pre-distorters.

11. A multi-band power amplifier system, comprising:
   at least a first pre-distorter and a second pre-distorter, the first pre-distorter having a first output and the second pre-distorter having a second output, both the first and second pre-distorters receiving as inputs at least a first signal and a second signal;
   a power amplifier amplifying a signal derived from the first and second outputs of the first and second pre-distorters to produce a power amplifier output signal; and
   an adaptor, the adaptor configured to:
      receive a reference signal that is a combination of at least the first signal and the second signal, the at least first signal and second signal combined so that a spectrum of the first signal substantially overlaps a spectrum of the second signal;
      receive an observation signal that is a combination of at least a third signal and a fourth signal, at least the third signal and the fourth signal being derived from the power amplifier output signal, the at least third signal and fourth signal combined so that a spectrum of the third signal substantially overlaps a spectrum of the fourth signal; and
      compute a set of adaptation parameters to be used by at least the first and second pre-distorters.

12. The system of claim 11, wherein the adaptation parameters are coefficients of a polynomial applied by a corresponding pre-distorter to a signal received by the corresponding pre-distorter.

13. The system of claim 11, wherein the first signal and the second signal are substantially tuned to baseband.

14. The system of claim 11, wherein the third signal and the fourth signal are substantially tuned to baseband.

15. The system of claim 11, wherein the adaptation parameters are derived by minimizing an error between the reference signal and the observation signal.

16. The system of claim 11, wherein a sampling rate of the adapter is substantially N times a bandwidth of a one of the first or second signal having a largest bandwidth, where N is an order of non-linearity to be compensated by the first and second pre-distorters.

17. The system of claim 11, further comprising at least a first up-converter receiving the first output of the first pre-distorter and at least a second up-converter receiving the second output of the second pre-distorter.

18. The system of claim 17, further comprising a first filter and a second filter, the first filtering a first band of the power amplifier output signal and the second filter filtering a second band of the power amplifier output.

19. The system of claim 18, further comprising a first down-converter receiving an output of the first filter, and a second down-converter receiving an output of the second filter.

* * * * *

UNITED STATES PATENT AND TRADEMARK OFFICE
CERTIFICATE OF CORRECTION

PATENT NO. : 8,923,787 B2
APPLICATION NO. : 13/541852
DATED : December 30, 2014
INVENTOR(S) : Laporte It is certified that error appears in the above-identified patent and that said Letters Patent is hereby corrected as shown below:

On the Title Page, in Column 1, delete "(76)" and insert -- (75) --, therefor.

On the Title Page, in Column 1, below item (76), insert item -- (73) Assignee: Telefonaktiebolaget L M Ericsson (publ), Stockholm (SE). --.

In the Specification

In Column 1, Line 54, in Equation (03), delete "$y=f_{NL-IM3}(f_{PD-IM3}9x))$" and insert -- $y=f_{NL-IM3}(f_{PD-IM3}(x))$ --, therefor.

In Column 3, Line 32, in Equation (11), delete "$fs>5x(b_1+B_2)$" and insert -- $fs>5x(B_1+B_2)$ --, therefor.

In Column 5, Lines 51-55, in Equation (12), delete "
$$e = (x_1 + x_2) - \begin{pmatrix} (c_0 x_1 + c_1 x_1 |x_1|^2 + c_2 x_1 |x_2|^2 + c_3 x_1 |x_1|^4 + \\ c_4 x_1 |x_1|^2 |x_2|^2 + c_5 x_1 |x_2|^4) + \\ (c_0 x_2 + c_1 x_2 |x_2|^2 + c_2 x_2 |x_1|^2 + c_3 x_2 |x_2|^4 + \\ c_4 x_2 |x_2|^2 |x_1|^2 + c_5 x_2 |x_1|^4) \end{pmatrix}$$
" and insert --
$$e = (x_1 + x_2) - \begin{pmatrix} c_0 x_1 + c_1 x_1 |x_1|^2 + c_2 x_1 |x_2|^2 + c_3 x_1 |x_1|^4 + c_4 x_1 |x_1|^2 |x_2|^2 + c_5 x_1 |x_2|^4 \\ + c_0 x_2 + c_1 x_2 |x_2|^2 + c_2 x_2 |x_1|^2 + c_3 x_2 |x_2|^4 + c_4 x_2 |x_2|^2 |x_1|^2 + c_5 x_2 |x_1|^4 \end{pmatrix}$$
--, therefor.

In Column 5, Line 67, delete Equation No. "(4)" and insert Equation No. -- (14) --, therefor.

Signed and Sealed this
Fourteenth Day of June, 2016

Michelle K. Lee
*Director of the United States Patent and Trademark Office*

In Column 7, Lines 20-22, in Equation (17), delete "$10 \times \log_{10}\left(\dfrac{P_{adjacent\_chann\,el1}}{P_{assigned\_channel}}\right).$" and insert --$10 \times \log_{10}\left(\dfrac{P_{adjacent\_channel1}}{P_{assigned\_channel}}\right).$--, therefor.

In Column 7, Lines 27-28, in Equation (18), delete "$10 \times \log_{10}\left(\dfrac{P_{adjacent\_chann\,el2}}{P_{assigned\_channel}}\right).$" and insert --$10 \times \log_{10}\left(\dfrac{P_{adjacent\_channel2}}{P_{assigned\_channel}}\right).$--, therefor.